(12) United States Patent
Okawa et al.

(10) Patent No.: US 10,096,331 B2
(45) Date of Patent: Oct. 9, 2018

(54) COUPLED SOFT BIAS SCISSOR TYPE SENSOR

(71) Applicant: Western Digital Technologies, Inc., San Jose, CA (US)

(72) Inventors: Norihiro Okawa, Odawara (JP); Koujiro Komagaki, Odawara (JP); Takahiro Ibusuki, Tokyo (JP)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/709,359

(22) Filed: Sep. 19, 2017

(65) Prior Publication Data

US 2018/0005652 A1 Jan. 4, 2018

Related U.S. Application Data

(62) Division of application No. 14/987,568, filed on Jan. 4, 2016, now Pat. No. 9,799,356.

(51) Int. Cl.
*G11B 5/39* (2006.01)
*G11B 5/127* (2006.01)

(52) U.S. Cl.
CPC .......... *G11B 5/3912* (2013.01); *G11B 5/1278* (2013.01); *G11B 5/3932* (2013.01)

(58) Field of Classification Search
None
See application file for complete search history.

(56) References Cited

U.S. PATENT DOCUMENTS

| | | | |
|---|---|---|---|
| 4,639,806 A | 1/1987 | Kira et al. | |
| 4,987,509 A | 1/1991 | Gill et al. | |
| 7,177,122 B2 | 2/2007 | Hou et al. | |
| 7,826,179 B2 * | 11/2010 | Shimazawa | B82Y 25/00 |
| | | | 360/319 |
| 8,339,751 B2 | 12/2012 | Garfunkel et al. | |
| 8,422,177 B2 * | 4/2013 | Fernandez-de-Castro | ................ |
| | | | G11B 5/3912 |
| | | | 360/319 |
| 8,749,926 B1 | 6/2014 | Le et al. | |
| 8,902,544 B2 | 12/2014 | Braganca et al. | |
| 8,913,349 B2 * | 12/2014 | Yamane | G11B 5/3932 |
| | | | 360/319 |
| 9,076,468 B1 | 7/2015 | Keener et al. | |
| 9,129,622 B2 * | 9/2015 | Machita | G01R 33/093 |
| 2010/0039734 A1 | 2/2010 | Hara et al. | |
| 2011/0007426 A1 | 1/2011 | Qiu et al. | |

(Continued)

FOREIGN PATENT DOCUMENTS

WO WO03060882 A1 7/2003

*Primary Examiner* — William J Klimowicz

(57) ABSTRACT

A magnetic read head is provided, comprising a bottom magnetic shield, a first free magnetic layer, a second free magnetic layer, and a top magnetic shield, arranged from bottom to top in this order in a stacking direction from a leading side to a trailing side of the read head. A non-soft bias layer is positioned below the top magnetic shield and on a back side of the first and the second free magnetic layers. The top magnetic shield has a unidirectional anisotropy, the magnetic moments of the top and the bottom magnetic shields are canted relative to a plane of the first and the second free magnetic layers, and the top and the bottom magnetic shields are decoupled from the non-soft bias layer and not magnetically coupled to a soft bias layer.

9 Claims, 15 Drawing Sheets

(56) References Cited

U.S. PATENT DOCUMENTS

| | | |
|---|---|---|
| 2011/0260272 A1 | 10/2011 | Lee et al. |
| 2014/0268405 A1* | 9/2014 | Machita ............... G01R 33/093 360/75 |
| 2014/0293474 A1* | 10/2014 | Yamane ............... G11B 5/3932 360/75 |
| 2014/0293475 A1* | 10/2014 | Degawa ............... G11B 5/3932 360/75 |
| 2015/0002961 A1 | 1/2015 | Keener et al. |
| 2015/0147481 A1 | 5/2015 | Braganca et al. |
| 2015/0154990 A1 | 6/2015 | Jiang et al. |
| 2015/0154991 A1 | 6/2015 | Le et al. |

\* cited by examiner

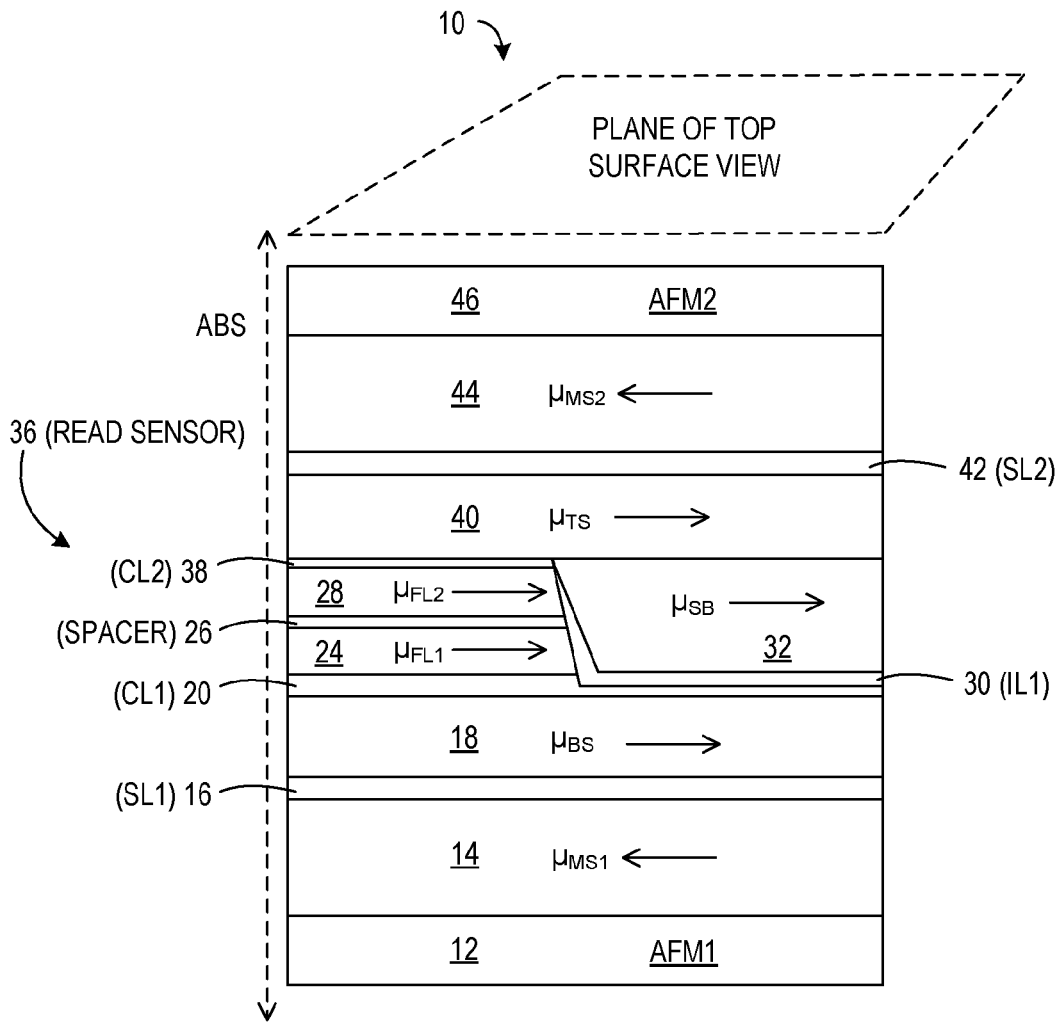

AFM2 = SECOND ANTIFERROMAGNETIC LAYER
MS2 = SECOND MAGNETIC SEED LAYER
SL2 = SECOND SEED LAYER
TS = TOP MAGNETIC SHIELD
SB = SOFT BIAS LAYER
CL2 = SECOND COUPLING LAYER
FL2 = SECOND FREE MAGNETIC LAYER
FL1 = FIRST FREE MAGNETIC LAYER
CL1 = FIRST COUPLING LAYER
IL1 = BOTTOM INSULATOR LAYER
BS = BOTTOM MAGNETIC SHIELD
SL1 = FIRST SEED LAYER
MS1 = FIRST MAGNETIC SEED LAYER
AFM1 = FIRST ANTIFERROMAGNETIC LAYER

FIG. 5A

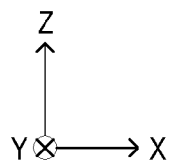

COUPLED SOFT BIAS SCISSOR TYPE SENSOR

CROSS-REFERENCE TO RELATED APPLICATIONS

This application is a divisional of and claims the benefit of priority to pending U.S. patent application Ser. No. 14/987,568 filed on Jan. 4, 2016, the entire content of which is incorporated by reference for all purposes as if fully set forth herein.

BACKGROUND

In recent years, the read heads of magnetoresistive devices and recording bits on magnetic recording media have become progressively smaller, and as a result, the recording density of stored data has increased. Smaller recording bits generate smaller magnetic flux and smaller output signals, which increase the sensitivity requirements of the read head. A scissor type sensor, which has two free ferromagnetic layers being coupled in anti-parallel directions relative to each other, has been proposed to further improve the sensitivity of the read head. One difficulty encountered is that when various stresses, including external magnetic fields and heat, are applied to read heads with scissor type sensors, bias magnetization reversal often occurs and causes hysteresis in the transfer curve. These complications have limited the practical application of scissor type sensors in conventional magnetoresistive devices.

BRIEF DESCRIPTION OF THE DRAWINGS

The present disclosure is illustrated by way of example and not by way of limitation in the figures of the accompanying drawings, in which the like reference numerals indicate like elements and in which:

FIG. 5A is a cross-sectional view of a magnetic read head according to the first embodiment of the invention;

DETAILED DESCRIPTION

A selected embodiment of the present invention will now be described with reference to the accompanying drawings. It will be apparent to those skilled in the art from this disclosure that the following description of an embodiment of the invention is provided for illustration only and not for the purpose of limiting the invention as defined by the appended claims and their equivalents.

Figure 1:
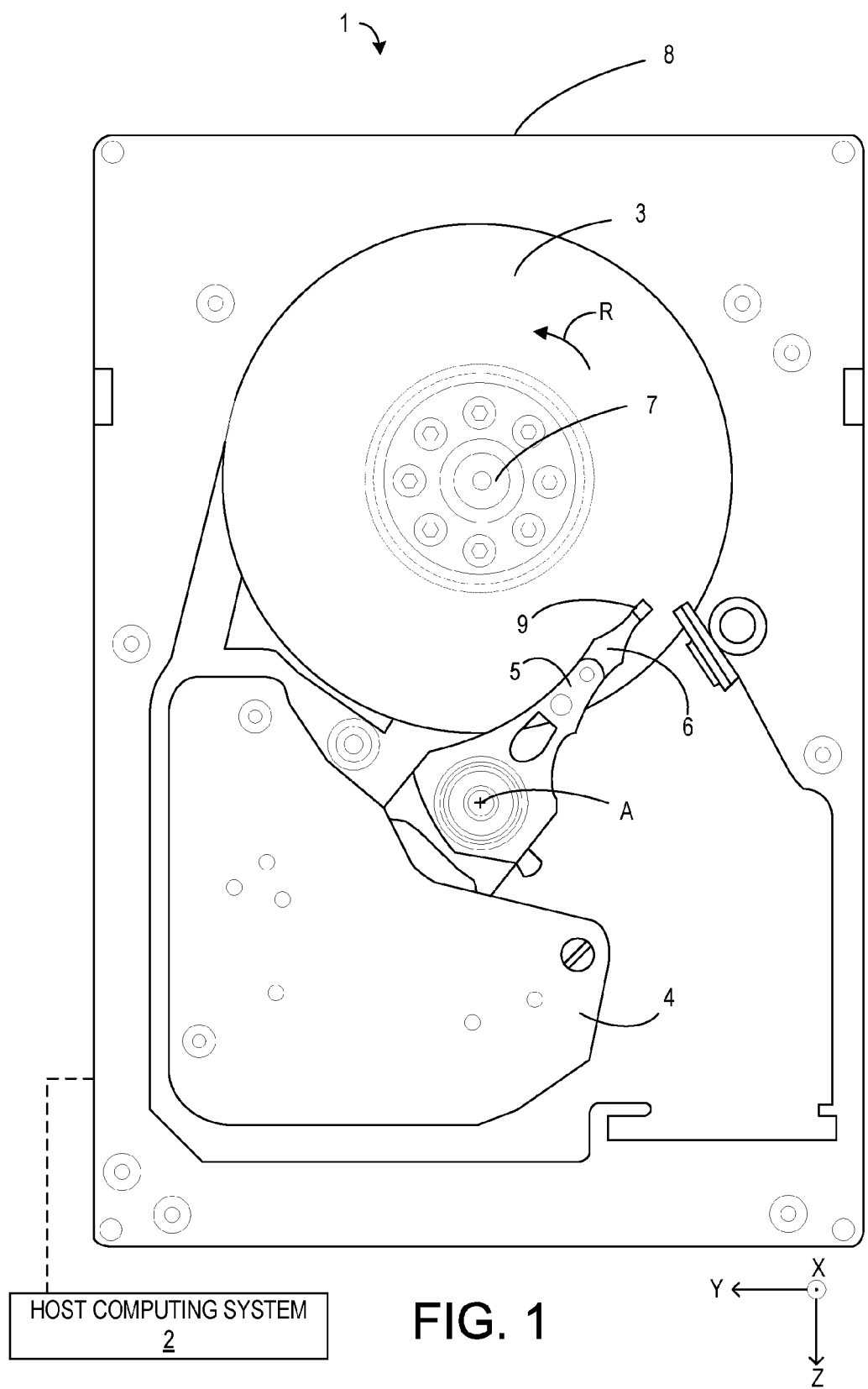
FIG. 1 illustrates an exemplary magnetic disk drive, according to one disclosed embodiment.
Figure 2:
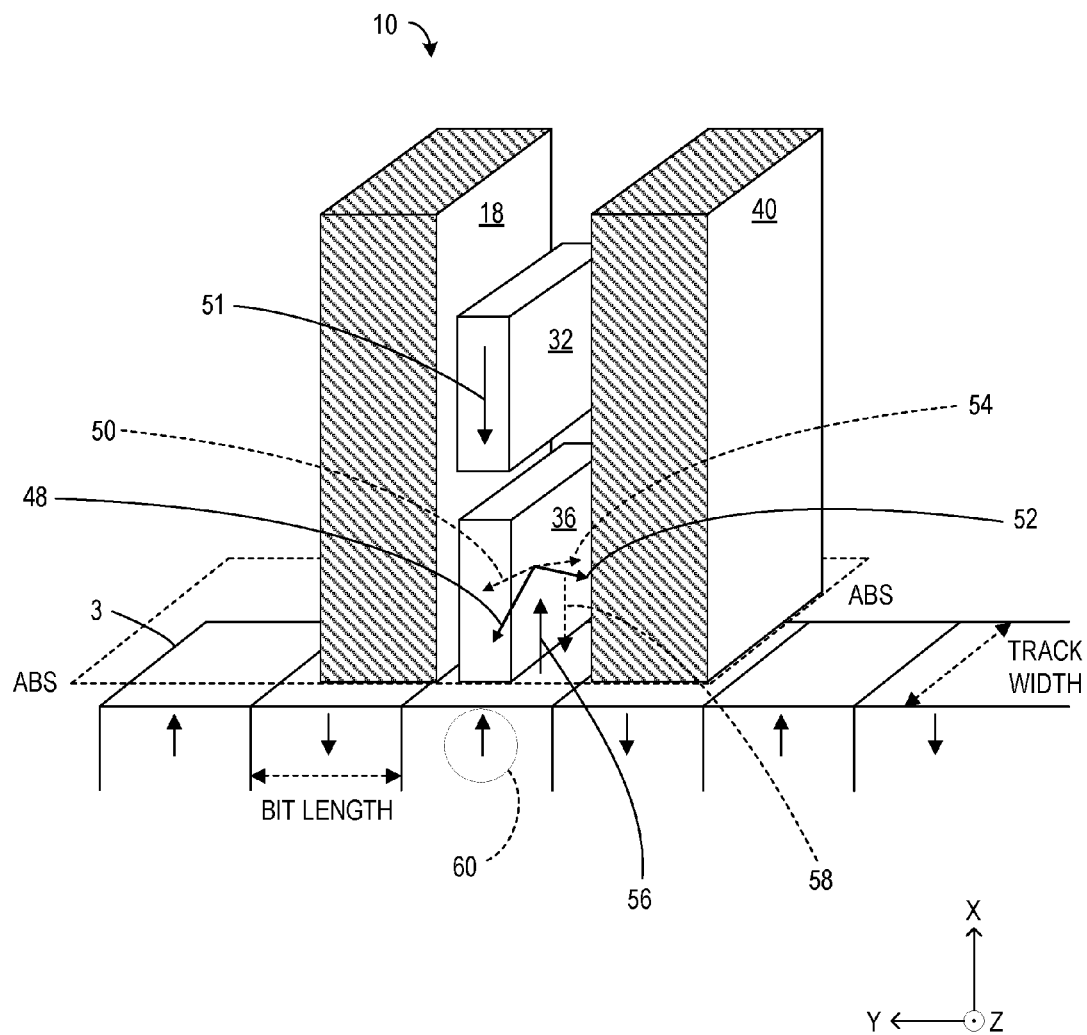
FIG. 2 is a schematic partial cross-sectional view through the middle section of a magnetic read head according to an embodiment of the invention.

The present disclosure is directed to a TMR (tunnel junction magnetoresistive) and CPP-GMR (current perpendicular to plane giant magnetoresistive) read head, an embodiment of which is shown beginning in FIG. 2, for a magnetic recording system such as a disk drive as shown in FIG. 1.

Turning initially to FIG. 1, this Figure illustrates a top view of an exemplary hard disk drive (HDD) 1, according to an embodiment of the disclosure. HDD 1 is coupled to an associated host computing system 2, and is used to store information used by the computing system during processing. As illustrated, HDD 1 may include one or more perpendicular magnetic recording media 3, actuators 4, actuator arms 5, and suspension arms 6 associated with each of the perpendicular magnetic recording media 3, and a spindle motor 7 affixed in a chassis 8. The perpendicular magnetic recording media 3 may be arranged in a vertical stack, if more than one is provided. Moreover, the one or more perpendicular magnetic recording media 3 may be coupled with the spindle motor 7 for rotation in a rotation direction R.

Perpendicular magnetic recording media 3 may include tracks of data on both the top and bottom surfaces of the disk. A magnetic head mounted on a slider 9 may be positioned on a track. As each disk spins, data may be written on and/or read from the data track via a corresponding write head and read head of the recording head. The slider 9 may be coupled to an actuator arm 5 via a suspension arm 6. Actuator arm 5 may be configured to rotate about actuator axis A to place the magnetic head on a particular data track. It is to be understood that the actuator arm 5 alternatively may be configured to move in a manner other than swiveling around actuator axis A.

The suspension arm 6 biases the slider 9 so that the slider 9 bends towards the surface of the perpendicular magnetic recording media 3 when stationary. When the perpendicular magnetic recording media 3 rotates, air is swirled by the rotating disk 3 adjacent to a media facing surface (MFS) of the slider 9, causing the slider 9 to ride on an air bearing a slight distance from the surface of the rotating media 3. For this reason, the MFS is also referred to as an air bearing surface (ABS). When the slider rides on the air bearing, the read and write heads are employed for reading and writing magnetic transitions corresponding to host data of the host computing system 2. The read and write heads are connected to signal processing circuitry that operates according to a computer program implemented in a processor or other logic circuitry integrated within or coupled to the HDD 1 to thereby implement the reading and writing functions.

FIG. 2 is a schematic partial cross-sectional view through the middle section of a read head 10 of the magnetic head mounted on the slider 9 of FIG. 1, facing the recording media 3. The read head 10 in the magnetoresistive device includes an ABS, and is mounted such that the ABS is facing the recording media 3. The recording media 3 is illustrated with perpendicularly recorded or magnetized bits, each of which occupies a region of the recording media 3 defined by a bit length and track width, with adjacent regions having magnetization directions as represented by the arrows located in the recording media 3. The magnetic fields of the adjacent bits are detectable by the read sensor 36 in the read head 10. The read sensor 36 is positioned between a top magnetic shield 40 and a bottom magnetic shield 18, each formed of a soft magnetic metal film. The top magnetic shield 40 and bottom magnetic shield 18 function to shield the read head from recorded data bits that are neighboring the data bit being read. A soft bias layer 32 is positioned behind the read sensor 36 in a direction away from the ABS to provide a bias magnetic field to the read sensor 36. It is to be understood that while the description has been made with reference to perpendicularly recorded regions, the embodiments disclosed herein are not limited to perpendicular recorded regions. The embodiments disclosed herein are equally applicable to other magnetic recording possibilities as well. It will be appreciated that this is a schematic view with some layers of the read head 10 omitted and proportions exaggerated to illustrate the relationships between the magnetic shields, read sensor 36, and recording media 3.

Figure 3:
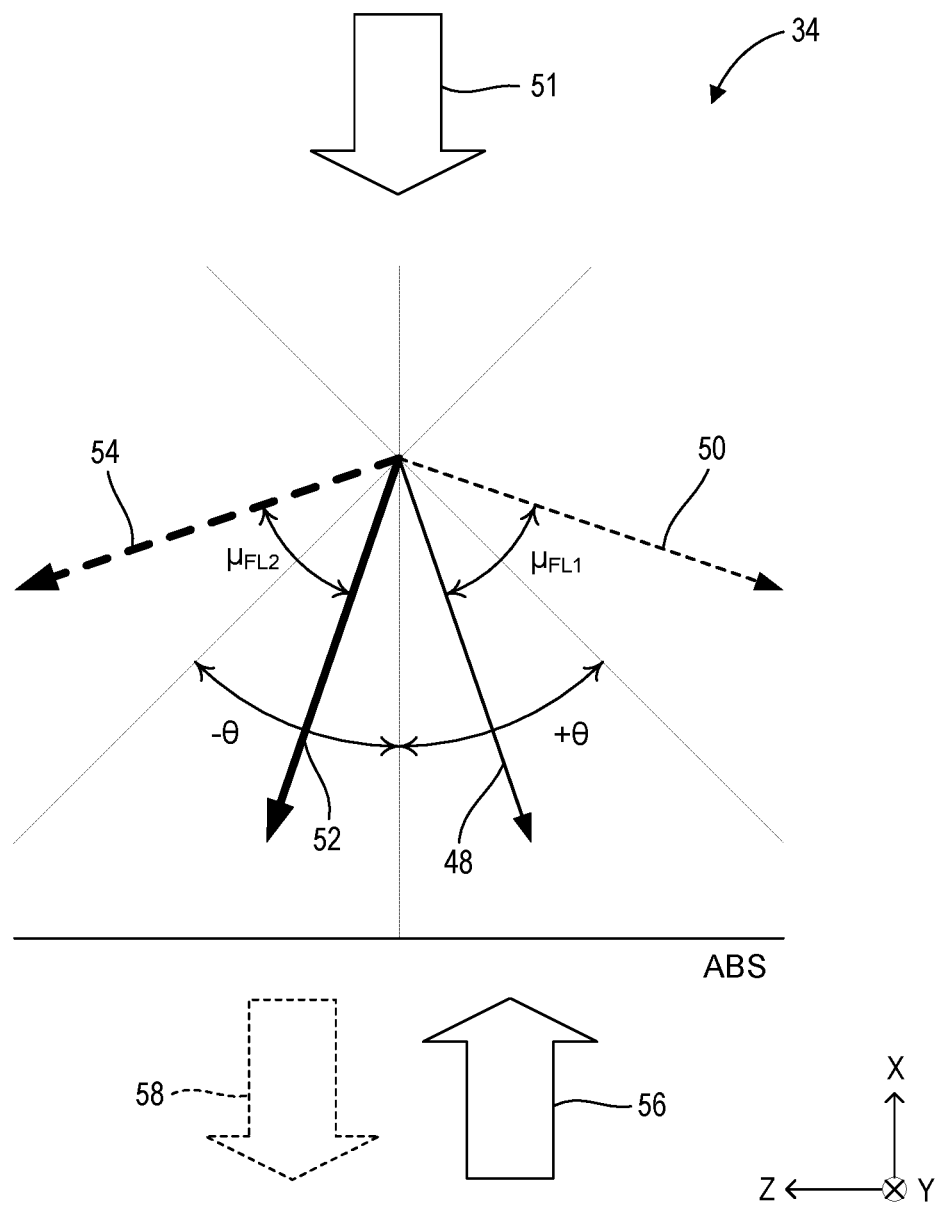
FIG. 3 is a schematic view of the magnetization directions of the read sensor of the magnetic read head according to an embodiment of the invention.

Referring to FIGS. 2 and 3, a stray magnetic field 56 from the media is applied to the read sensor 36 of the TMR read head 10 in the depth direction (X-axis direction), so that the magnetic moments $\mu_{FL1}$ and $\mu_{FL2}$ of the read sensor 36 may be configured in opposite directions, including magnetization directions 50 and 54 that tilt from the ABS. A bias magnetic field 51 is applied to the read sensor 36 from the soft bias layer 32 in the stripe height direction (−X direction). FIG. 3 is a schematic view of the magnetization directions of the read sensor 36 of the magnetic read head 10. The read sensor 36 receives a bias magnetic field 51 from the soft bias layer 32 in the −X direction, and also receives bias fields in the −Z and +Z directions from the bottom magnetic shield 18 and the top magnetic shield 40. If one of the magnetic moments tilts toward the +θ direction, the other magnetic moment tilts towards the opposite −θ direction. These magnetic configurations are established by the +Z direction bias field, the −Z direction bias field, and the −X direction bias field. These three kinds of bias fields are generated by a +Z biasing measure, −Z biasing measure, and −X biasing measure, respectively. As a stray magnetic field 56 from the media is applied, flowing from the ABS side into the device side, both magnetic moments of the read sensor 36 change their directions to grow more parallel to the ABS, as illustrated by the magnetization directions 50 and 54. On the other hand, when an opposite stray magnetic field 58 flowing from the device side into the ABS side is applied, both magnetic moments of the read sensor 36 change their directions to grow more perpendicular to the ABS, as illustrated by the magnetization directions 48 and 52. By measuring the changes of the magnetic moments of the read sensor 36 as a resistance change, it is possible to detect different stray magnetic fields 56 and 58 from the media depending on the target bit 60 that is being read on the recording media 3.

Figure 4A:
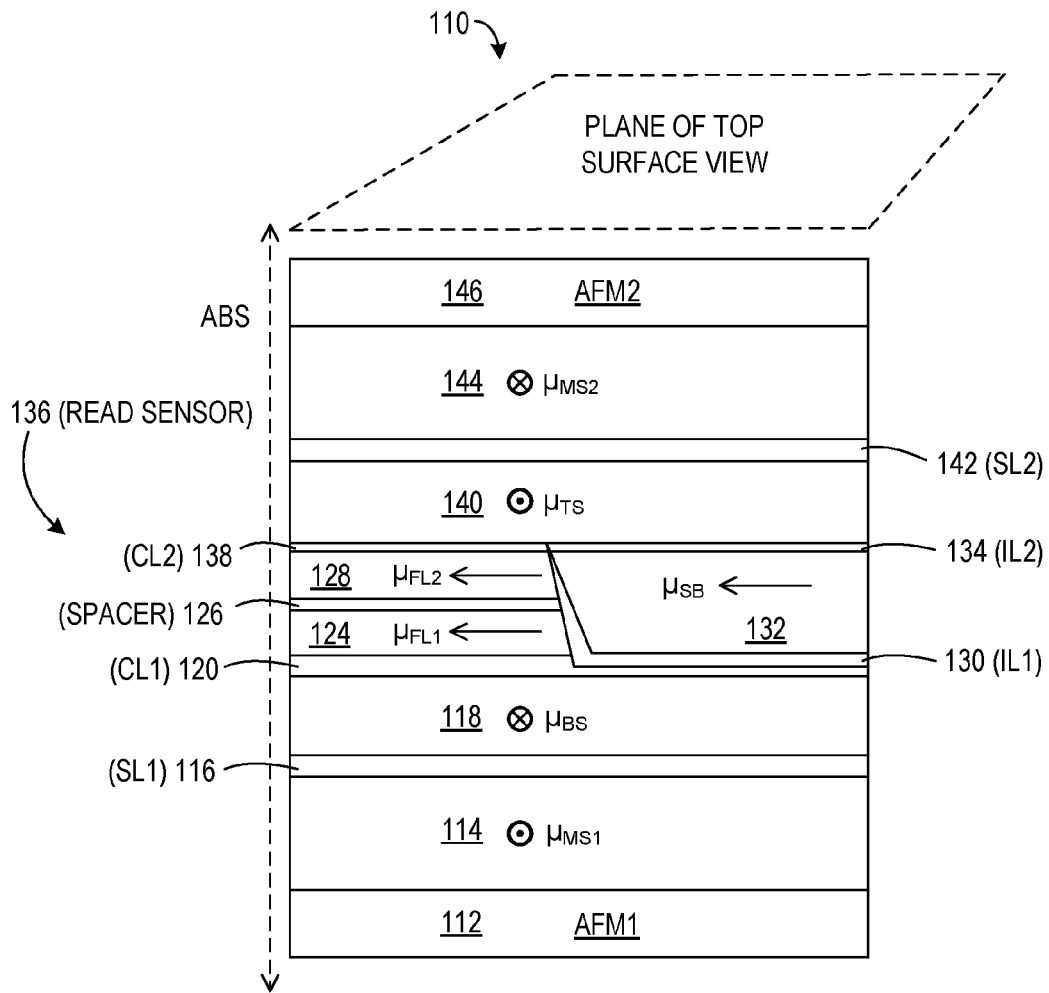
FIG. 4A is a cross-sectional view of a conventional scissor type magnetic read sensor.

Referring to FIG. 4A, a cross-sectional view of a conventional scissor type magnetic read head is depicted. Magnetization directions are represented by arrows superimposed on selected layers. The conventional read head 110 comprises a first antiferromagnetic (AFM) layer 112. Positioned above the first AFM layer 112 are the first magnetic seed layer 114, first seed layer 116, bottom magnetic shield 118, first coupling layer 120, first free magnetic layer 124, spacer 126, and second free magnetic layer 128, in this order. Positioned above the second free magnetic layer 128 are the second coupling layer 138, top magnetic shield 140, second seed layer 142, second magnetic seed layer 144, and second AFM layer 146, in this order. A soft bias layer is positioned on a side of the first free magnetic layer 124 and second free magnetic layer 128. A bottom insulator 130, positioned between the soft bias layer 132 and the first coupling layer 120 and the read sensor 136. An additional top insulator 134 is positioned above the soft bias layer 132 to insulate and decouple the soft bias layer 132 from the top magnetic shield 140. As illustrated by arrows, the magnetic moments of the top magnetic shield 140 ($\mu_{TS}$) and bottom magnetic shield 118 ($\mu_{BS}$) are in opposite directions in an antiparallel magnetization state. The first free magnetic layer 124 is magnetically coupled to the bottom magnetic shield 118 through the first coupling layer 120, and the second free magnetic layer 128 is magnetically coupled to the top magnetic shield 140 through the second coupling layer 138. However, the soft bias layer 132 is decoupled from the free magnetic layers and the magnetic shields due to the top insulator 134 and bottom insulator 130, which surround the soft bias layer 132.

Figure 4B:
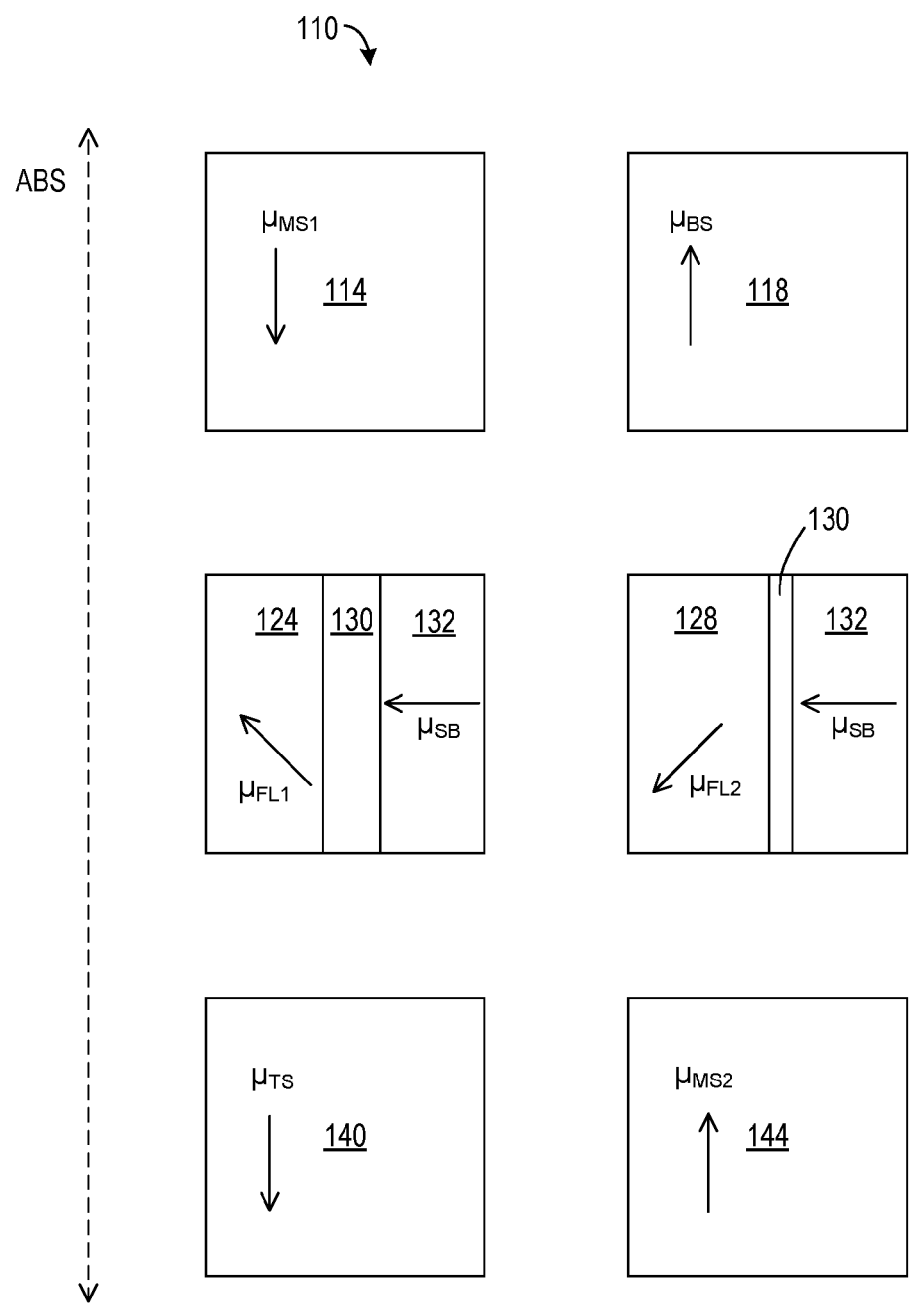
FIG. 4B is a top surface view illustrating the magnetization directions of the conventional scissor type magnetic read sensor.

Referring to FIG. 4B, the magnetic moments of the first magnetic seed layer 114, bottom magnetic shield 118, first free magnetic layer 124, second free magnetic layer 128, top magnetic shield 140, second magnetic seed layer 144, and soft bias layer 132 of the conventional read head 110 are depicted from the top surface view perspective of FIG. 4A. For illustrative purposes, the directions of the magnetic moments are shown in each layer in six views, each showing the magnetic moment of one layer. Here, it will be appreciated that the direction of the magnetic moment of the soft bias layer 132 is decoupled from the free magnetic layers or the top and bottom magnetic shields. The magnetic moment of the soft bias layer 132 is perpendicular to that of the top magnetic shield 140. The weak magnetic coupling of the free magnetic layers to the shields is tenuous because of the slight mismatch in the directions of the magnetic moments of the top magnetic shield 140 to the second free magnetic layer 128 and the bottom magnetic shield 118 to the first free magnetic layer 124.

Figure 4C:
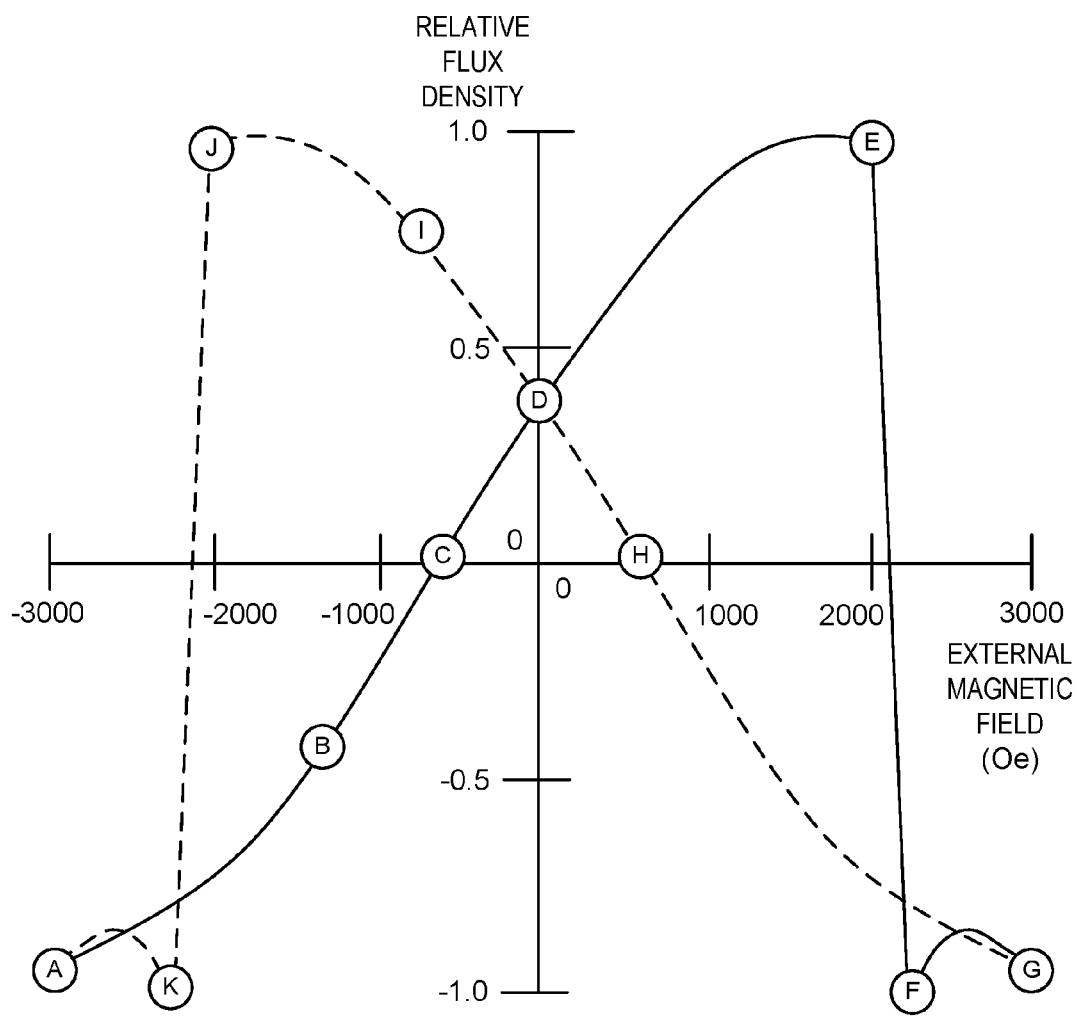
FIG. 4C is a plot illustrating the hysteresis loop of the conventional scissor type magnetic read sensor.

Referring to FIG. 4C, an example hysteresis loop of the conventional read sensor 136 is illustrated, depicting transfer curves moving on different paths depending on how the external magnetic field, being applied to the read sensor 136, has been changed. The loop is generated by measuring the flux density of the ferromagnetic material of the read sensor while changing the external magnetic field that is applied to the read sensor. The loop begins at point A, where the read sensor is at a point of negative magnetic saturation and almost all of the magnetic domains of the read sensor are aligned in the negative direction, where an external magnetic field of −3000 Oe is applied. As the external magnetic field is gradually increased, the curve moves from point A to points B, C, D, and E along the solid line. After the negative flux density of the read sensor is gradually decreased to zero at point C, which is known as the point of coercivity, positive flux density begins to increase as the external magnetic field continues to increase. At point D, which is known as the point of retentivity, it can be seen that there is still some positive flux density in the read sensor, even though the external magnetic field is zero, and this indicates the residual magnetism of the read sensor. At point E, the read sensor reaches a point of positive magnetic saturation, and almost all of the magnetic domains of the read sensor are aligned in the positive direction, where an external magnetic field of approximately 2000 Oe is applied. Point E is also considered the depinning field, since any increase in the external magnetic field beyond point E results in a sudden, near linear magnetization drop and reversal of the alignment of the magnetic domains of the read sensor, which is considered an irreversible process. The read sensor subsequently remains in a state of negative magnetic saturation when the curve reaches point G, where the external magnetic field has reached 3000 Oe.

However, as the external magnetic field is gradually decreased from point G, the curve moves instead to points H, D, I, and J, exhibiting a large hysteresis. As the curve takes the dashed path in the Figure, the negative flux density of the read sensor is gradually decreased to zero at point H, after which the read sensor takes on a positive flux density, passing the point of retentivity (point D) again as the external magnetic field continues to decrease and the positive flux density continues to increase. Finally, the curve reaches point J, where the read sensor again reaches a point of positive magnetic saturation, and almost all of the magnetic domains of the read sensor are aligned in the positive direction, where an external magnetic field of approximately −2000 Oe is applied. Point J is also considered the depinning field, since any decrease in the external magnetic field beyond point J results in a sudden, near linear magnetization drop and reversal of the alignment of the magnetic domains of the read sensor, which is also considered an irreversible process. The read sensor subsequently remains in a state of negative magnetic saturation when the curve reaches point A, where the external magnetic field has reached −3000 Oe.

The large hysteresis that is exhibited by conventional scissor type read sensor, as described above, results in unpredictable changes in the magnetic moments of the conventional read sensor when exposed to various external stresses, including extraneous electromagnetic fields and heat. During normal use, the read sensor is expected to be exposed to various external magnetic fields that fluctuate in various manners, increasing the probability that the read sensor may experience undesired reversals in magnetic moments during operation. Thus, conventional read sensors fail to configure the hysteresis loop and reversal process of the read head to minimize hysteresis and eliminate irreversible switching processes that may lead, at different times, to different magnetizations of the read sensor at the same external magnetic field, thereby limiting the practical application of conventional scissor type read heads.

To address the above described challenge, a cross-sectional view of a magnetic read head 10 according to a first embodiment of the invention is shown in FIG. 5A. Magnetization directions are represented by arrows superimposed on selected layers. Like the conventional read head 110 in FIG. 4A, the magnetic read head 10 comprises a first AFM layer 12. Positioned above the first AFM layer 12 are the first magnetic seed layer 14, first seed layer 16, and bottom magnetic shield 18, in this order. The magnetic read head 10 comprises a bottom magnetic shield 18, first free magnetic layer 24, a second free magnetic layer 28, and a top magnetic shield 40 arranged from bottom to top, in this order in a stacking direction (Z-axis direction) from a leading side to a trailing side of the read head, and a soft bias layer 32 is positioned below the top magnetic shield 40 and on a back side of the first free magnetic layer 24 and second free magnetic layer 28. The soft bias layer 32 is directly coupled to the top magnetic shield 40, which has a unidirectional anisotropy. The first free magnetic layer 24 is magnetically coupled to the bottom magnetic shield 18 through the first coupling layer 20, and the second free magnetic layer 28 is magnetically coupled to the top magnetic shield 40 through the second coupling layer 38. An insulator layer 30 is positioned between the soft bias layer 32 and the first coupling layer 20 and borders the back side of the first free magnetic layer 24, spacer 26, second free magnetic layer 28, and second coupling layer 38, preventing sensing current from flowing through any other portion except for the read sensor. However, unlike the conventional read head 110, there is no top insulator layer that is interposed between the soft bias layer 32 and the top magnetic shield 40, thereby facilitating coupling between the soft bias layer 32 and the top magnetic shield 40. It will be appreciated that other intervening layers may be configured within the read head, and the spacer 26 and coupling layers may be alternatively included or excluded from the read head configuration as long as the relative configurations of the magnetic shields, the free magnetic layers, and the soft bias layer are preserved. Furthermore, the second seed layer 42, a second magnetic seed layer 44, and second AFM layer 46 are positioned above the top magnetic shield 40 in this order from the leading side to the trailing side of the read head.

The first seed layer 16 may comprise a Ta or Co-based amorphous alloy and have a thickness of 15 Å. The first magnetic seed layer 14 and second magnetic seed layer 44 may comprise a NiFe alloy. The second seed layer 42 may comprise Ru or Ir and have a thickness of 10 Å or less. The first AFM layer 12 and second AFM layer 46 may comprise MnIr alloy and have a thickness of between 60 and 80 Å. The first coupling layer 20 may comprise double layers of CoFe alloy and Co-based amorphous alloy. The first coupling layer 20 may also comprise a Ru component layer as one of the sandwiched layers of CoFe alloy and Ru/CoFe alloy, or one of the sandwiched layers of NiFe alloy and Ru/NiFe alloy. The Co-based amorphous alloy may comprise Co and at least one of the elements chosen from Ta, Zr, Nb, Hf, and Ti. The insulator layer 30 may comprise $Al_2O_3$ and tilt approximately 45 degrees relative to the ABS plane where it forms an interface with the coupling layers, the free magnetic layers, and the spacer 26. The spacer 26 may comprise a multilayer structure such as Cu/ZnO/Cu or Cu/ZnO/Zn and have a thickness of approximately 10 Å. The first free magnetic layer 24 and second free magnetic layer 28 may have thicknesses of approximately 70 Å and comprise layers of NiFe, CoFe, CoFeB, CoFeBTa, Ni, Fe, Co, and/or alloys thereof. The second coupling layer 38 may comprise Ru or ferromagnetic materials such as Ni or Ni alloys. The soft bias layer 32 may comprise Co, Ni, Fe, and/or an alloy thereof such as CoFe or NiFe. The bottom magnetic shield 18 and top magnetic shield 40 may comprise magnetically permeable material and each have thicknesses of approximately 130 to 150 Å.

Figure 5B:
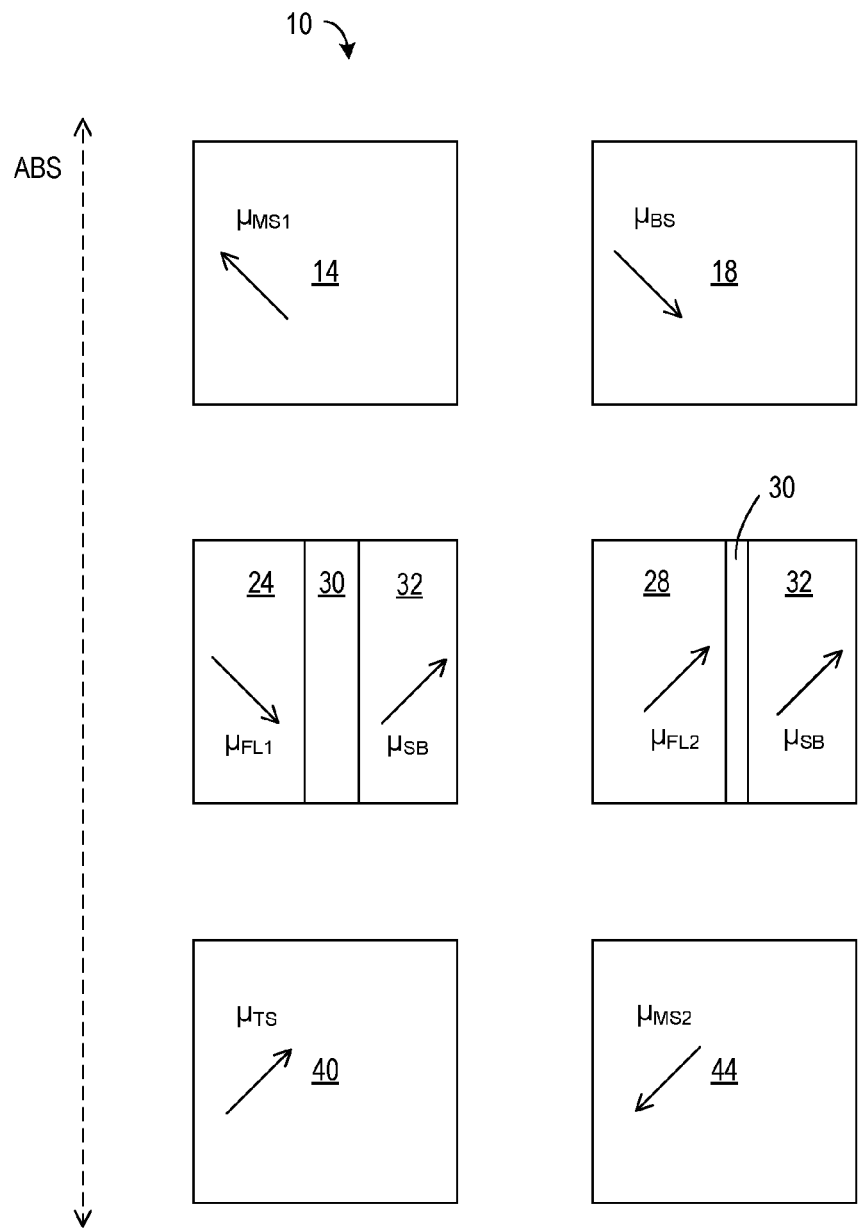
FIG. 5B is a top surface view illustrating the magnetization directions of the magnetic read head according to the first embodiment.

Referring to FIG. 5B, the magnetic moments of the first magnetic seed layer 14, bottom magnetic shield 18, first free magnetic layer 24, second free magnetic layer 28, top magnetic shield 40, second magnetic seed layer 44, and soft bias layer 32 of the read head 10 of the first embodiment are depicted from the top surface view perspective of FIG. 5A. Like FIG. 4B, the directions of the magnetic moments are shown in each layer in six views in the same orientation for illustrative purposes, each view showing the magnetic moment of one layer. It will be noted that the soft bias layer 32 is directly coupled to the top magnetic shield 40, and the top magnetic shield 40 has a unidirectional anisotropy. The magnetic moment of the top magnetic shield 40 is configured perpendicularly to that of the bottom magnetic shield 18 in a plane perpendicular to the ABS, where the top magnetic shield 40 is weakly exchange coupled to the second free magnetic layer 28 through the second coupling layer 38, and the bottom magnetic shield 18 is weakly coupled to the first free magnetic layer 24 through the first coupling layer 20. This adds stability to the magnetization of the read sensor and reduces the large hysteresis that often occurs in conventional read sensors, and also increases the magnetic utilization of the read head. Furthermore, the second magnetic seed layer 44 is antiferromagnetically coupled to the top magnetic shield 40 through the second AFM layer 46, which is positioned above the top magnetic shield 40, and the first magnetic seed layer 14 is antiferromagnetically coupled to the bottom magnetic shield 18 through the first AFM layer 12, which is positioned below the bottom magnetic shield 18. It will be appreciated that the first AFM layer 12 and the second AFM layer 46 do not have spontaneous magnetization, but have ordered magnetic moments at the atomic level. These antiferromagnetic couplings reduce the probability of shield-induced erasure of recorded information, even when the magnetic shields are canted.

Figure 5C:
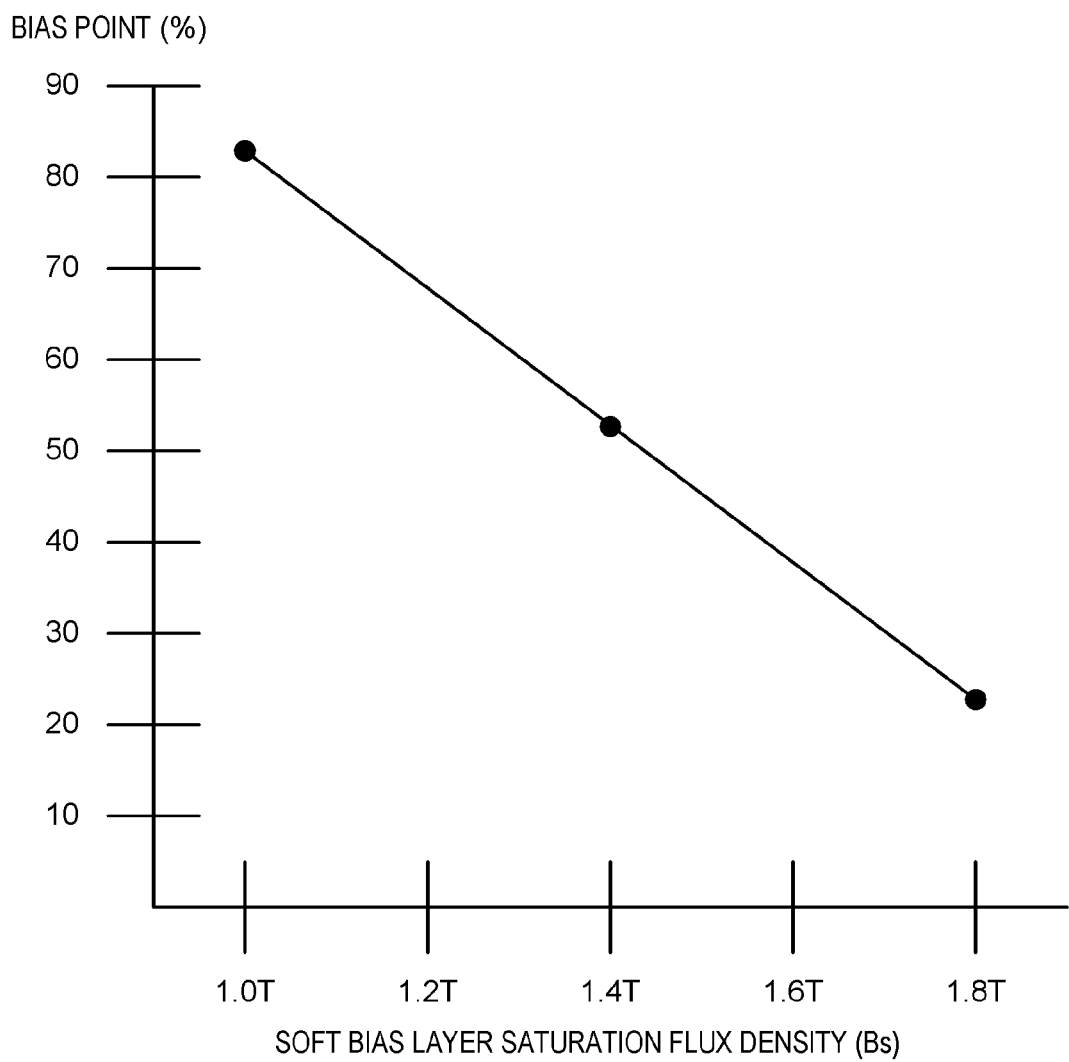
FIG. 5C is a plot illustrating the linear relationship between the bias point of the magnetic read sensor and the saturation flux density of the soft bias layer for the magnetic read head according to the first embodiment.

Referring to FIG. 5C, the bias point of the read sensor is linearly dependent on the magnetic flux density (Bs) of the soft bias layer, which may be adjusted by changing the material composition of the soft bias layer. The magnetic flux density (Bs) may be configured as 1.0 T (alternatively within a range of 0.8 T to 1.2 T), 1.4 T (alternatively within a range of 1.2 T to 1.6 T), or 1.8 T (alternatively within a range of 1.6 T to 2.0 T). At a Bs value of 1.0 T, the bias point is 82.6%, while at a Bs value of 1.8 T, the bias point is 22.4%. Bias points correspond to the points of retentivity of the soft bias layer, or the residual flux that remains in the soft bias layer when the external magnetic field is zero. It will be appreciated that higher magnetic flux densities (Bs) result in smaller bias points due to larger T-biases. Smaller bias points may result in lower magnetic utilization because of the effects of a weaker demagnetizing field, while larger bias points may result in higher magnetic utilization because of the effects of a stronger demagnetizing field. On the other hand, larger bias points may result in larger hysteresis, which may not be desirable in the practical application of read sensors. Thus, the requirements of increasing magnetic utilization are balanced with the requirements of reducing hysteresis in selecting the magnetic flux density (Bs) of the soft bias layer.

Figure 5D:
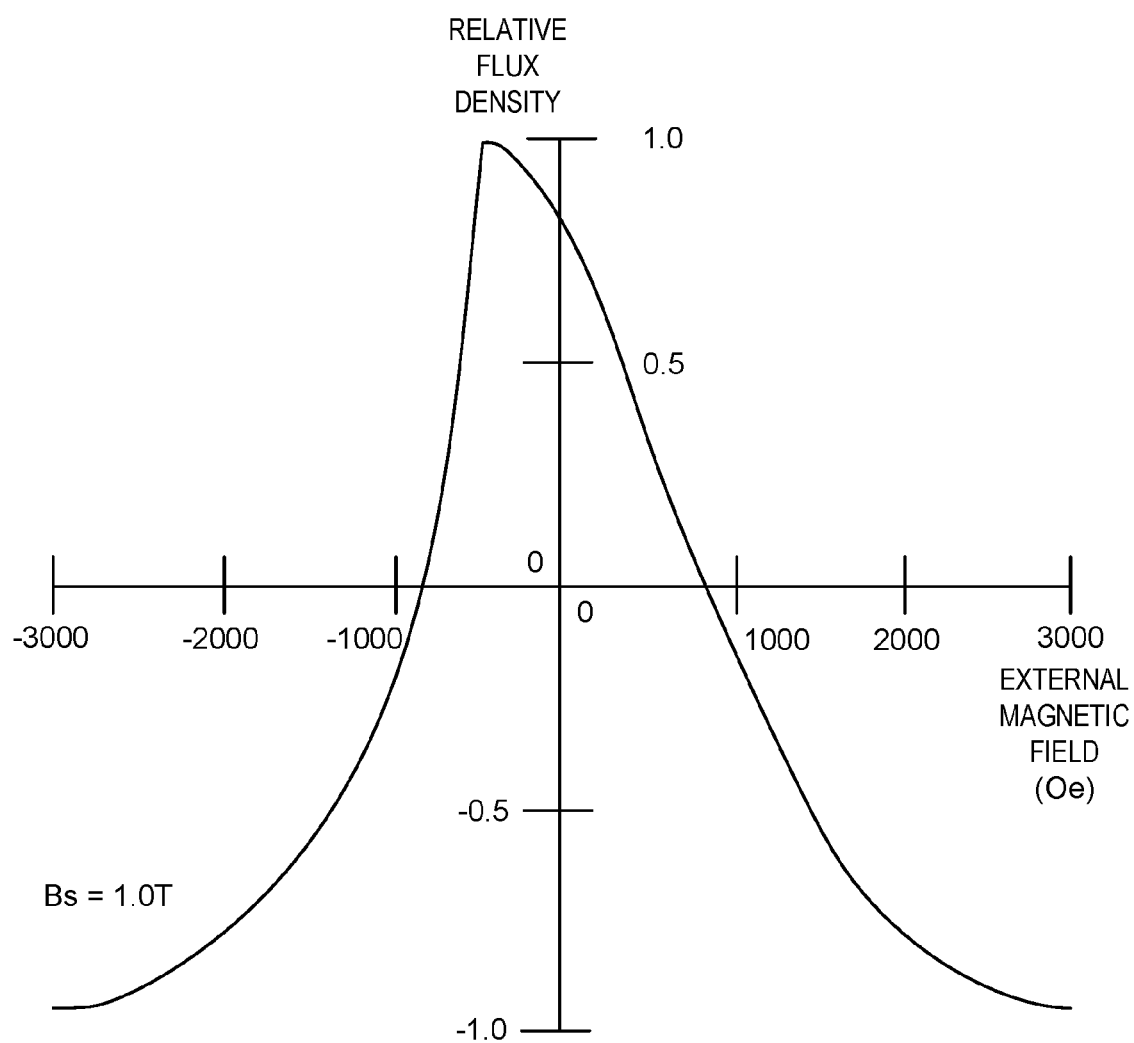
FIG. 5D is a plot illustrating the hysteresis loop of the magnetic read sensor according to the first embodiment, where the saturation flux density of the soft bias layer is 1.0 T.

Referring to FIG. 5D, a first hysteresis loop of the read sensor 36 of the first embodiment is illustrated, depicting the path that the transfer curve moves on as the external magnetic field, being applied to the read sensor, is changed. The loop is generated by measuring the flux density of the ferromagnetic material of the read sensor while keeping the saturation flux density of the soft bias layer at 1.0 T, and changing the external magnetic field that is applied to the read sensor. In contrast to the hysteresis loop of the conventional read sensor 136, as shown in FIG. 4C, it will be appreciated that the read sensor 36 exhibits no hysteresis, depinning fields, or irreversible processes that result in sudden reversals and realignments of the magnetic domains of the read sensor. Thus, unlike conventional read sensors 136, the read sensor 36 of the first embodiment at a soft bias Bs of 1.0 T is less likely to exhibit different magnetizations of the read sensor at the same external magnetic field, thereby improving the practical application of read heads due to improvements in stability under external thermal and electromagnetic stresses.

Figure 5E:
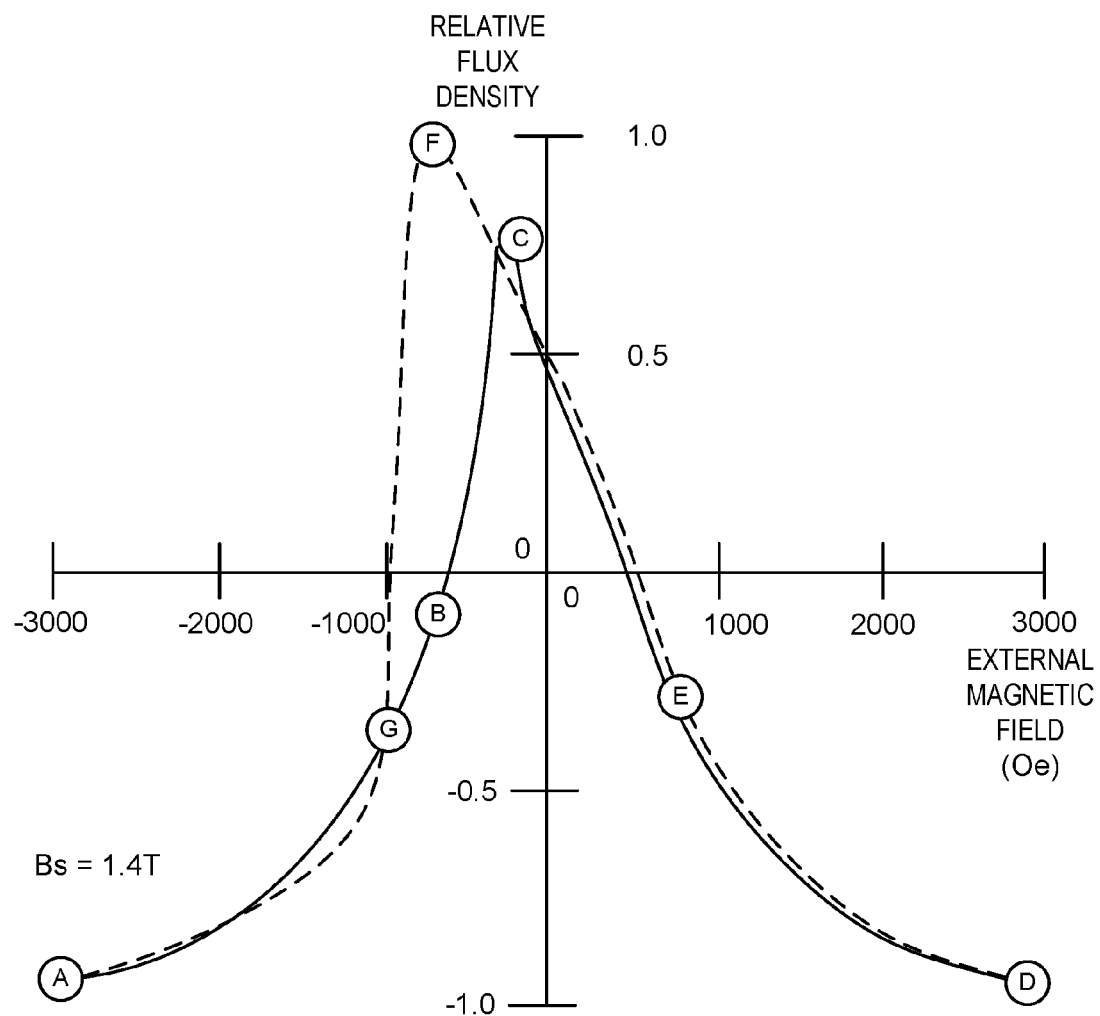
FIG. 5E is a plot illustrating the hysteresis loop of the magnetic read sensor according to the first embodiment, where the saturation flux density of the soft bias layer is 1.4 T.

Referring to FIG. 5E, a second hysteresis loop of the read sensor 36 of the first embodiment is illustrated, depicting the path that the transfer curve moves on as the external magnetic field, being applied to the read sensor, is changed. The loop is generated by measuring the flux density of the ferromagnetic material of the read sensor while keeping the saturation flux density of the soft bias layer at 1.4 T, and changing the external magnetic field that is applied to the read sensor. As the external magnetic field is gradually increased, the curve moves from point A to points B, C, D, and E along the solid line. However, as the external magnetic field is gradually decreased from point E, the curve starts to exhibit hysteresis at an external magnetic field between 0 and −1000 Oe, reaching a depinning field at point F and resulting in a sudden, near linear magnetization drop and reversal of the alignment of the magnetic domains of the read sensor before hysteresis disappears at point G, where the external magnetic field is approximately −1000 Oe. Thus, the degree of hysteresis of the first embodiment at Bs=1.4 T is greater than the first embodiment at Bs=1.0 T, but smaller when compared to conventional read sensors. On the other hand, the magnetic utilization of the first embodiment at Bs=1.4 T is greater than both conventional sensors and the first embodiment at Bs=1.0 T.

Figure 5F:
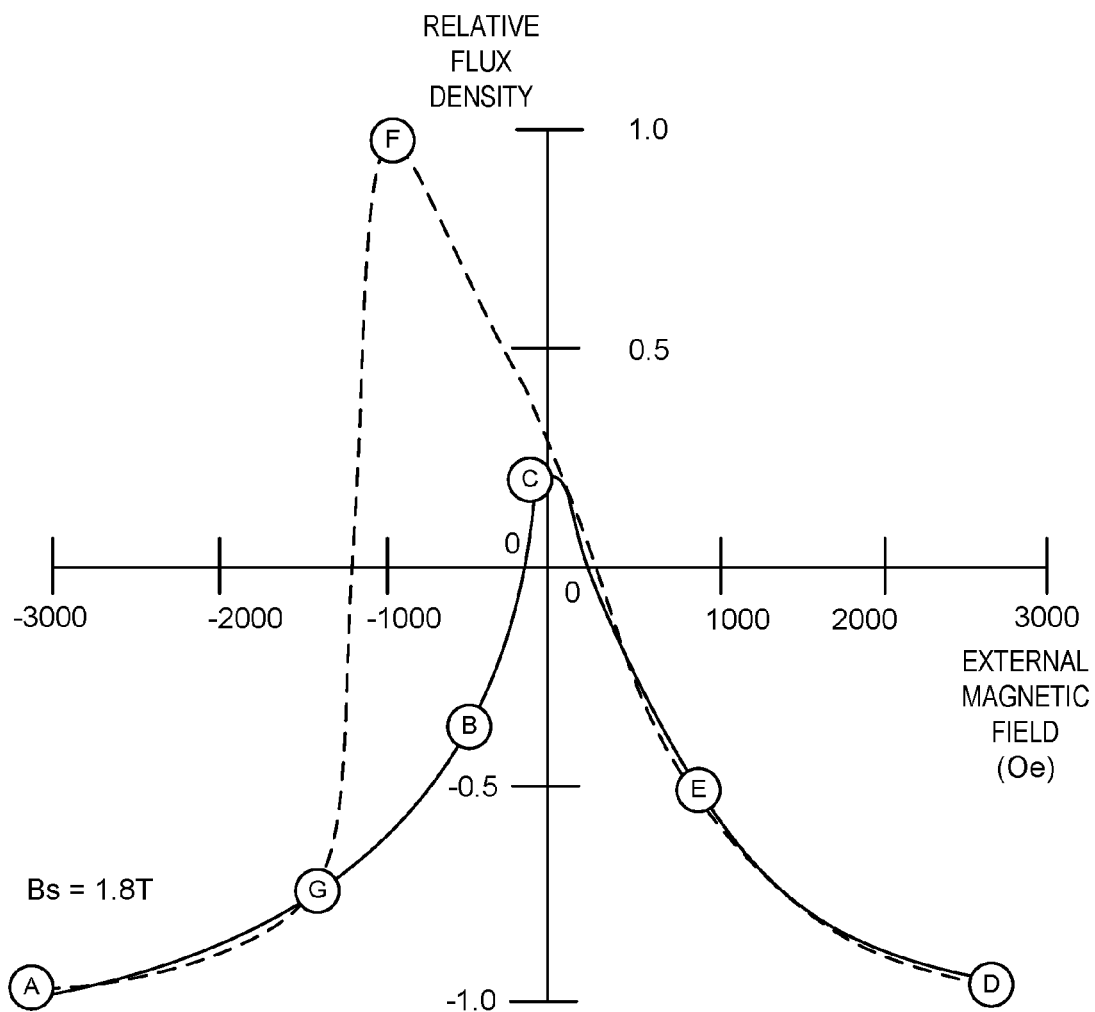
FIG. 5F is a plot illustrating the hysteresis loop of the magnetic read sensor according to the first embodiment, where the saturation flux density of the soft bias layer is 1.8 T.

Referring to FIG. 5F, a third hysteresis loop of the read sensor 36 of the first embodiment is illustrated, depicting the path that the transfer curve moves on as the external magnetic field, being applied to the read sensor, is changed. The loop is generated by measuring the flux density of the ferromagnetic material of the read sensor while keeping the saturation flux density of the soft bias layer at 1.8 T, and changing the external magnetic field that is applied to the read sensor. As the external magnetic field is gradually increased, the curve moves from point A to points B, C, and D along the solid line. However, as the external magnetic field is gradually decreased from point E, the curve starts to exhibit hysteresis at an external magnetic field between 0 and −1500 Oe, reaching a depinning field at point F and resulting in a sudden, near linear magnetization drop and reversal of the alignment of the magnetic domains of the read sensor before hysteresis disappears at point G, where the external magnetic field is approximately −1500 Oe. Thus, the degree of hysteresis of the first embodiment at Bs=1.8 T is greater than the first embodiment at Bs=1.0 T or 1.4 T, but smaller when compared to conventional read sensors. The point of retentivity is also the lowest compared to the first embodiments at Bs=1.0 T and Bs=1.4 T. On the other hand, the magnetic utilization of the first embodiment at Bs=1.8 T is greater than conventional sensors and the first embodiment at Bs=1.0 T and Bs=1.4 T. Consequently, increasing the magnetic flux density (Bs) of the soft bias layer is advantageous as long as hysteresis in the range of external magnetic field of approximately 0 to −1000 Oe or −1500 Oe does not interfere with the practical application of the read head of the present invention.

Figure 6A:
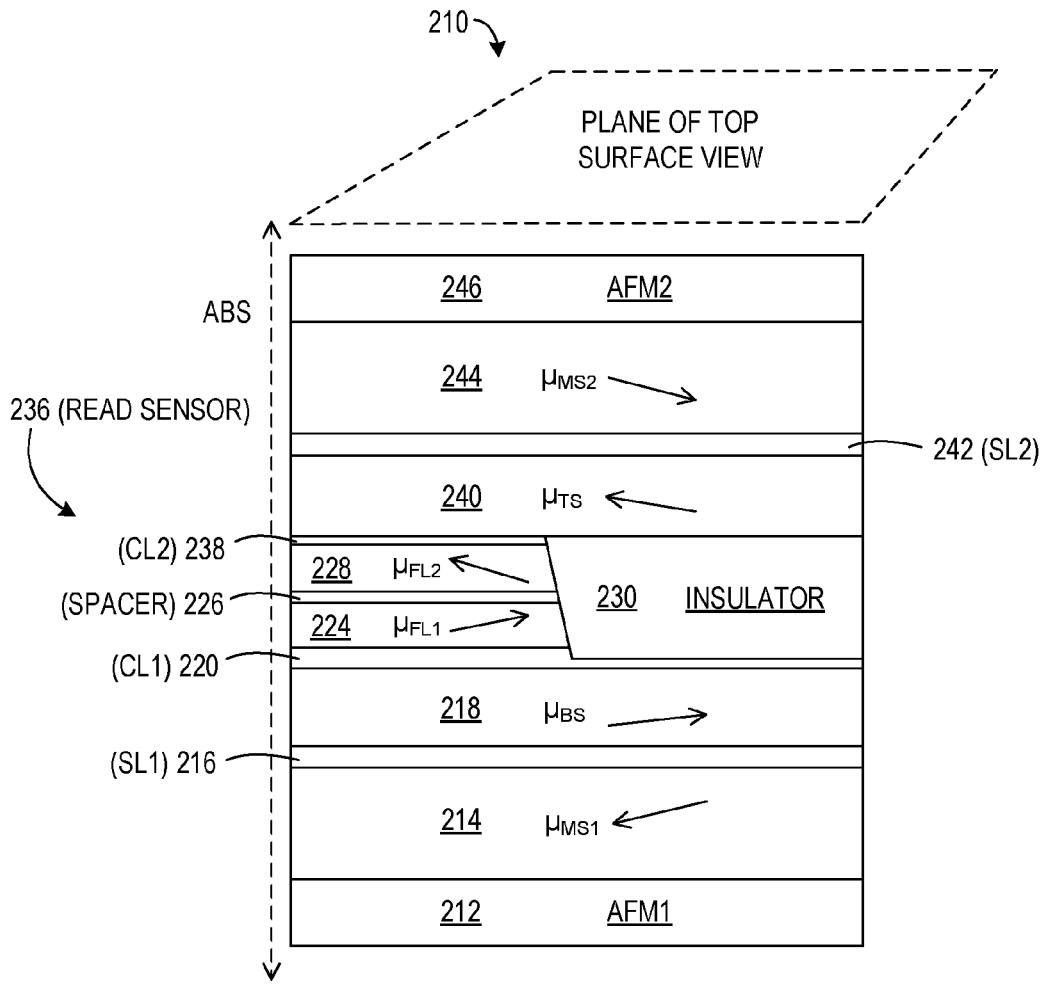
FIG. 6A is cross-sectional view of a magnetic read head according to the second embodiment of the invention.

Referring to FIG. 6A, a cross-sectional view of a magnetic read head 210 according to a second embodiment of the invention is shown. Magnetization directions are represented by arrows superimposed on selected layers. Since the read head 210 of the second embodiment is generally similar to that of the first embodiment with the exception of the absence of the soft bias layer, the detailed description thereof is abbreviated here for the sake of brevity. It is to be noted that like parts are designated by like reference numerals throughout the detailed description and the accompanying drawings. In this embodiment, the soft bias layer of the first embodiment has been replaced by an insulator layer that borders the back side of the first coupling layer 220, first free magnetic layer 224, spacer 226, second free magnetic layer 228, and second coupling layer 238. Thus, in this embodiment, a non-soft bias layer (an insulator layer 230) is positioned below the top magnetic shield 240, which has a unidirectional anisotropy, and on a back side of the first free magnetic layer 224 and the second free magnetic layer 228, so that the top and bottom magnetic shields are decoupled from the non-soft bias layer 230 and not coupled to a soft bias layer. Furthermore, the magnetic moments of the top magnetic shield 240 and the bottom magnetic shield 218 are canted relative to the plane of the layers of the read sensor 236, including the first free magnetic layer 224 and the second free magnetic layer 228. In other words, the directions of the magnetic moments of the top magnetic shield 240 ($\mu_{TS}$) and the bottom magnetic shield 218 ($\mu_{BS}$) do not run parallel to the plane of the layers of the read sensor 236, which include the first free magnetic layer 224 and the second free magnetic layer 228. Rather, the magnetic moments PTS and PBS point into or away from the plane of the read sensor layers so as to form an acute angle relative to these layers. Because the bottom magnetic shield 218 is weakly coupled to the first free magnetic layer 224 through the first coupling layer 220, and the top magnetic shield 240 is weakly coupled to the second free magnetic layer 228 through the second coupling layer 238, the magnetic moments of the first free magnetic layer 224 and second free magnetic layer 228 are likewise canted. Like the first embodiment, the second magnetic seed layer 244 is antiferromagnetically coupled to the top magnetic shield 240 through the second AFM layer 246, which is positioned above the top magnetic shield 240, and the first magnetic seed layer 214 is antiferromagnetically coupled to the bottom magnetic shield 218 through the first AFM layer 212, which is positioned below the bottom magnetic shield 218. These antiferromagnetic couplings, which are more stable than the first embodiment due to the absence of the soft bias layer, reduce the probability of shield-induced erasure of recorded information. It will be appreciated that other intervening layers may be configured within the read head 210, and the spacer 226 and coupling layers may be alternatively included or excluded from the read head configuration as long as the relative configurations of the magnetic shields and the free magnetic layers are preserved. The insulator layer 230 may be replaced by any other layer as long as it has no soft bias properties.

Figure 6B:
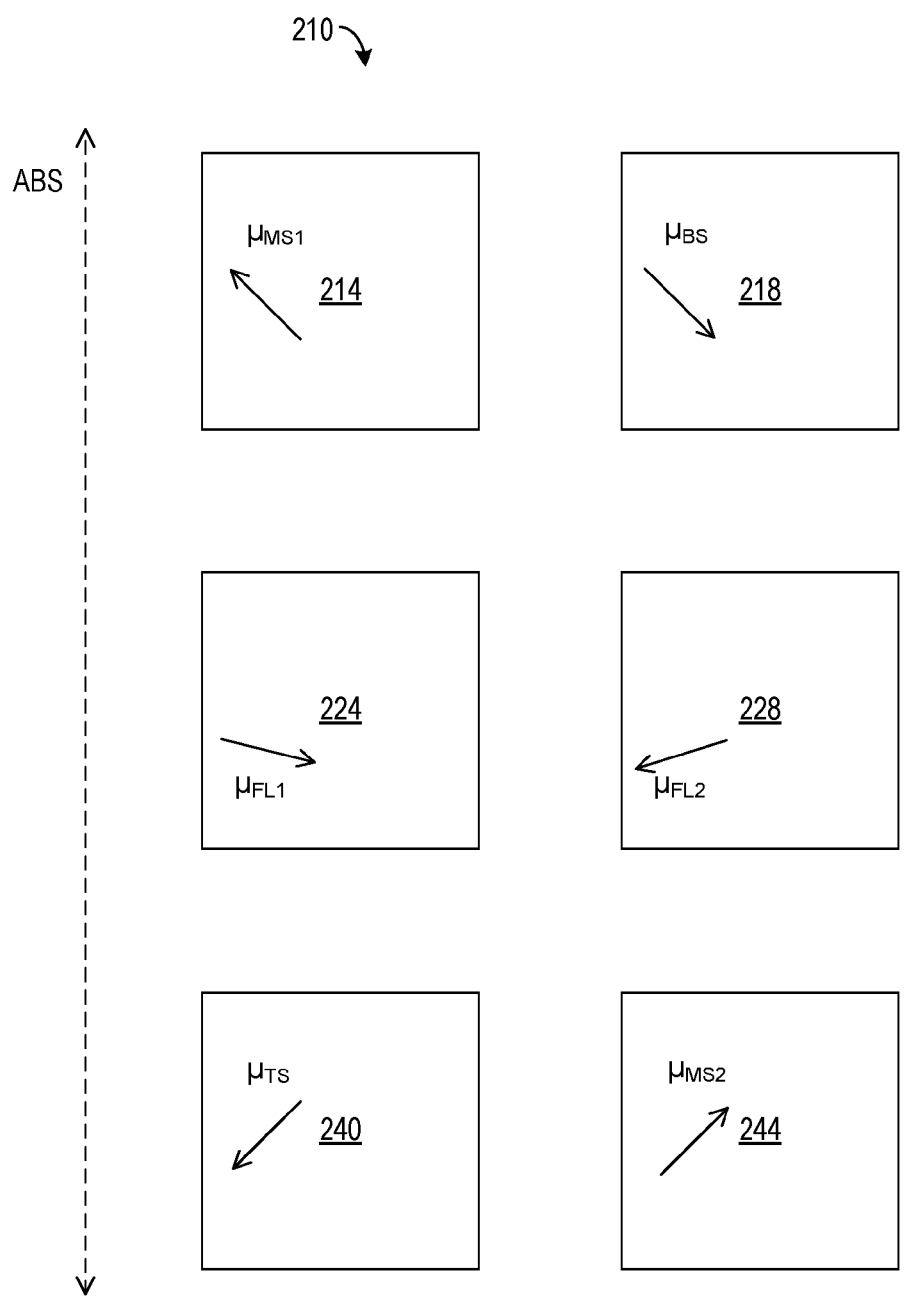
FIG. 6B is a top surface view illustrating the magnetization directions of the magnetic read head according to the second embodiment.

Referring to FIG. 6B, the magnetic moments of the first magnetic seed layer 214, bottom magnetic shield 218, first free magnetic layer 224, second free magnetic layer 228, top magnetic shield 240, and second magnetic seed layer 244 of the read head 210 of the first embodiment are depicted from the top surface view perspective of FIG. 6A. Like FIGS. 4B and 5B, the directions of the magnetic moments are shown in each layer in six views for illustrative purposes, each view showing the magnetic moment of one layer. It will be noted that, in the second embodiment, the strong residual magnetism of the read sensor 236 at zero external magnetic field results in a strong, substantially anti-parallel configuration of the magnetic moments of the first free magnetic layer 224 and the second free magnetic layer 228, which may prevent the same degree of freedom in the orthogonal configuration of the magnetic moments $\mu_{FL1}$ and $\mu_{FL2}$ as in the first embodiment. It will be noted that, like the first embodiment, the magnetic moment of the top magnetic shield 240 is also configured perpendicularly to that of the bottom magnetic shield 218 in a plane perpendicular to the ABS, where the top magnetic shield 240 is weakly exchange coupled to the second free magnetic layer 228 through the second coupling layer 238, and the bottom magnetic shield 218 is weakly coupled to the first free magnetic layer 224 through the first coupling layer 220. This adds stability to the magnetization of the read sensor and reduces the large hysteresis that often occurs in conventional read sensors, and also increases the magnetic utilization of the read head.

Figure 6C:
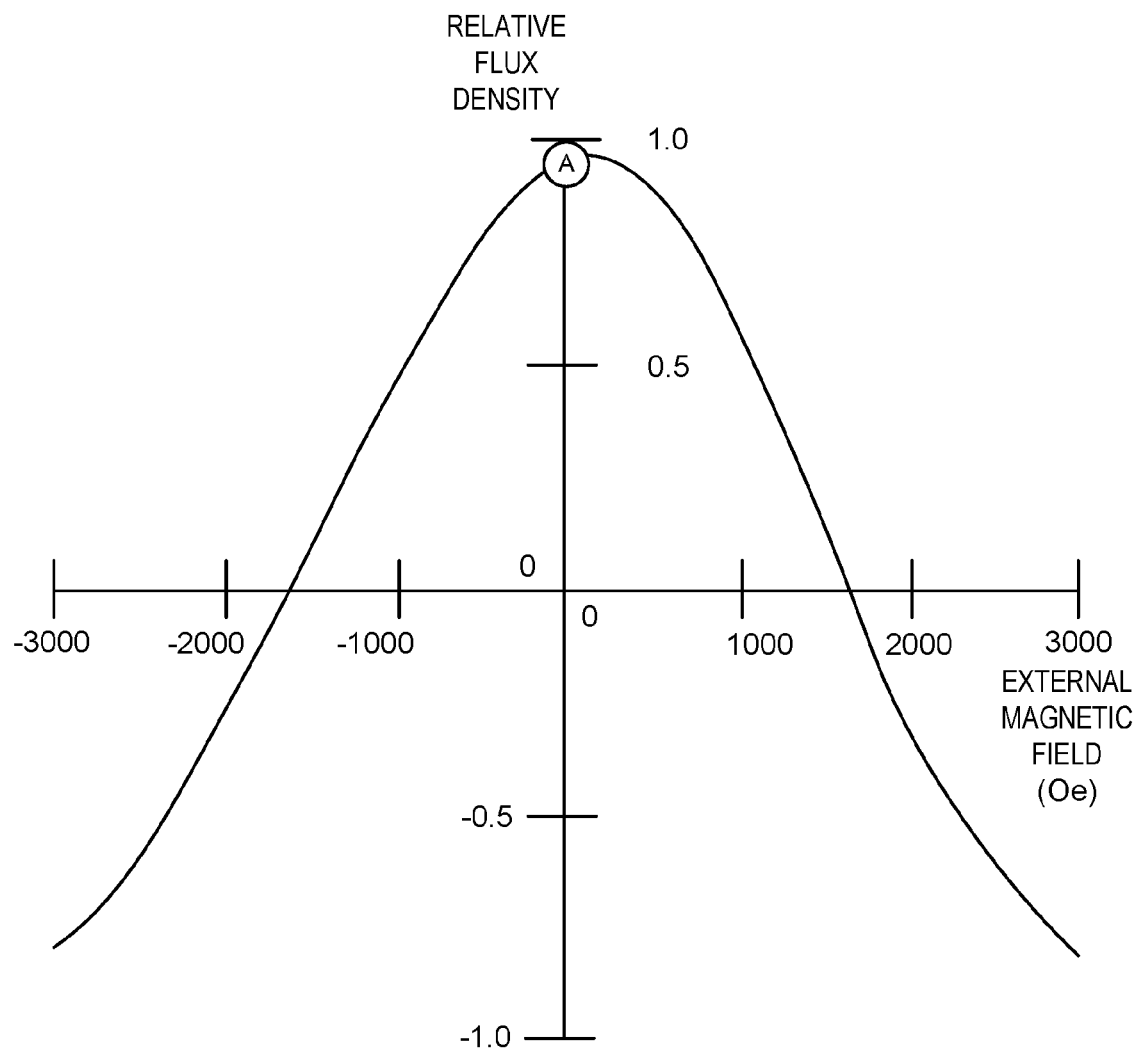
FIG. 6C is a plot illustrating the hysteresis loop of the magnetic read sensor according to the second embodiment.

Referring to FIG. 6C, a hysteresis loop of the read sensor 236 of the second embodiment is illustrated, depicting the path that the transfer curve moves on as the external magnetic field, being applied to the read sensor, is changed. The loop is generated by measuring the flux density of the ferromagnetic material of the read sensor while changing the external magnetic field that is applied to the read sensor. Like the hysteresis loop of the read sensor 36 of the first embodiment, it will be appreciated that the read sensor 236 of the second embodiment also exhibits no hysteresis, depinning fields, or irreversible processes that result in sudden reversals and realignments of the magnetic domains of the read sensor. Thus, the read sensor 236 of the second embodiment is also unlikely to exhibit different magnetizations of the read sensor at the same external magnetic field, thereby improving the practical application of read heads. As noted at point A, the point of retentivity is high for the second embodiment, resulting in strong residual magnetism of the read sensor 236 at zero external magnetic field, as described above. In accordance with the second embodiment, the read sensor 236 achieves reduced magnetic instability due to the absence of a soft bias layer, but consequently may also prevent the same degree of freedom in the orthogonal configuration of the free magnetic layers as the first embodiment.

It will be understood that the configurations and/or approaches described herein are exemplary in nature, and that these specific embodiments or examples are not to be considered in a limiting sense, because numerous variations are possible. The subject matter of the present disclosure includes all novel and nonobvious combinations and sub-combinations of the various processes, systems and configurations, and other features, functions, acts, and/or properties disclosed herein, as well as any and all equivalents thereof.

The invention claimed is:
1. A read head comprising:
a bottom magnetic shield, a first free magnetic layer, a second free magnetic layer, and a top magnetic shield, arranged in respective planes from bottom to top in this order in a stacking direction from a leading side to a trailing side of the read head, and
a non-soft bias layer positioned below the top magnetic shield and on a back side of the first free magnetic layer and the second free magnetic layer, wherein
the top magnetic shield has a unidirectional anisotropy,
a magnetic moment of the top magnetic shield is canted relative to the plane in which the first free magnetic layer is arranged and a magnetic moment of the bottom magnetic shield is canted relative to the plane in which the second free magnetic layer is arranged, and the top magnetic shield and the bottom magnetic shield are decoupled from the non-soft bias layer and not magnetically coupled to a soft bias layer.

2. The read head of claim 1, wherein
the non-soft bias layer comprises an insulator layer.

3. The read head of claim 1, wherein
the magnetic moment of the top magnetic shield is perpendicular to the magnetic moment of the bottom magnetic shield in a plane perpendicular to an air bearing surface,
the top magnetic shield is weakly coupled to the second free magnetic layer, and
the bottom magnetic shield is weakly coupled to the first free magnetic layer.

4. The read head of claim 1, further comprising:
a first antiferromagnetic layer positioned below the bottom magnetic shield; and
a second antiferromagnetic layer positioned above the top magnetic shield; wherein
the first antiferromagnetic layer is antiferromagnetically coupled to the bottom magnetic shield; and
the second antiferromagnetic layer is antiferromagnetically coupled to the top magnetic shield.

5. The read head of claim 4, wherein
the first antiferromagnetic layer and the second antiferromagnetic layer comprise a MnIr alloy.

6. A hard disk drive comprising the read head of claim 1.

7. An assisted recording system comprising the read head of claim 1.

8. The read head of claim 1, further comprising:
a first antiferromagnetic layer positioned below the bottom magnetic shield;
a first magnetic seed layer positioned above the first antiferromagnetic layer;
a second antiferromagnetic layer positioned above the top magnetic shield; and
a second magnetic seed layer positioned below the second antiferromagnetic layer;
wherein
the first magnetic seed layer is antiferromagnetically coupled to the bottom magnetic shield through the first antiferromagnetic layer; and
the second magnetic seed layer is antiferromagnetically coupled to the top magnetic shield through the second antiferromagnetic layer.

9. The read head of claim 1, wherein a magnetic moment of the first free magnetic layer is anti-parallel to a magnetic moment of the second free magnetic layer.

* * * * *